US012643433B2

(12) United States Patent
Park

(10) Patent No.: US 12,643,433 B2
(45) Date of Patent: Jun. 2, 2026

(54) ELECTRIFIED VEHICLE AND METHOD OF CONTROLLING BATTERY CONDITIONING THEREFOR

(71) Applicants: Hyundai Motor Company, Seoul (KR); Kia Corporation, Seoul (KR)

(72) Inventor: Hyun Soo Park, Seoul (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 811 days.

(21) Appl. No.: 17/948,746

(22) Filed: Sep. 20, 2022

(65) Prior Publication Data

US 2023/0264600 A1     Aug. 24, 2023

(30) Foreign Application Priority Data

Feb. 22, 2022     (KR) ........................ 10-2022-0023140

(51) Int. Cl.
| | |
|---|---|
| *H02J 7/00* | (2026.01) |
| *B60L 58/12* | (2019.01) |
| *B60L 58/24* | (2019.01) |
| *G01R 31/36* | (2020.01) |
| *H02J 7/14* | (2006.01) |

(52) U.S. Cl.
CPC .............. *B60L 58/24* (2019.02); *B60L 58/12* (2019.02); *G01R 31/3648* (2013.01); *H02J 7/875* (2026.01)

(58) Field of Classification Search
CPC .......... B60L 58/24; B60L 58/12; H02J 7/0069
USPC .................................................. 320/134, 132
See application file for complete search history.

(56) References Cited

U.S. PATENT DOCUMENTS

| | | | | |
|---|---|---|---|---|
| 9,139,091 B1 * | 9/2015 | Penilla | ............... | G06Q 30/0643 |
| 11,602,999 B1 * | 3/2023 | Flatland | ............... | G05D 1/0217 |
| 2012/0136535 A1 * | 5/2012 | Buford | .................... | B60L 58/33 |
| | | | | 701/36 |
| 2012/0158228 A1 * | 6/2012 | Biondo | ..................... | B60L 3/12 |
| | | | | 701/22 |
| 2014/0012447 A1 * | 1/2014 | Gao | ......................... | B60L 58/13 |
| | | | | 701/22 |
| 2014/0020415 A1 * | 1/2014 | Heyl | ........................ | F25B 40/00 |
| | | | | 62/119 |
| 2015/0100188 A1 * | 4/2015 | Wagner | ................... | B60L 58/24 |
| | | | | 903/903 |

(Continued)

FOREIGN PATENT DOCUMENTS

| | | |
|---|---|---|
| JP | 2017-0168328 A | 9/2017 |
| KR | 10-2014-0046295 A | 4/2014 |

(Continued)

*Primary Examiner* — Alexis B Pacheco
(74) *Attorney, Agent, or Firm* — Banner & Witcoff, Ltd.

(57)     ABSTRACT

Disclosed is an electric vehicle capable of more accurately determining whether to charge using external power and a battery conditioning control method therefor. A battery conditioning method for an electrified vehicle may include: determining whether one or more scenarios in which conditions are defined for each of at least one of the charge-inducing factors are satisfied; performing battery conditioning to increase the temperature of the battery when a satisfying scenario exists among the one or more scenarios; and updating the confidence level of the satisfying scenario according to whether actual charging occurs after the battery conditioning is performed.

19 Claims, 6 Drawing Sheets

*100*

(56)     References Cited

U.S. PATENT DOCUMENTS

| | | | | |
|---|---|---|---|---|
| 2016/0059733 | A1* | 3/2016 | Hettrich | B60L 58/27 |
| | | | | 701/2 |
| 2016/0197382 | A1* | 7/2016 | Sood | B60L 58/21 |
| | | | | 73/620 |
| 2016/0207416 | A1* | 7/2016 | Gauthier | G07C 5/085 |
| 2016/0368396 | A1* | 12/2016 | Konet | B60L 3/12 |
| 2017/0028978 | A1* | 2/2017 | Dunlap | B60W 10/26 |
| 2017/0129359 | A1* | 5/2017 | Dunlap | B60L 53/14 |
| 2017/0210390 | A1* | 7/2017 | Porras | B60K 6/40 |
| 2019/0016230 | A1* | 1/2019 | Wang | B60L 58/26 |
| 2019/0157882 | A1* | 5/2019 | Sherback | H02J 7/0013 |
| 2019/0226860 | A1* | 7/2019 | Fisher | B60L 53/66 |
| 2019/0359083 | A1 | 11/2019 | Hettrich et al. | |
| 2021/0242510 | A1* | 8/2021 | Li | B60L 58/12 |
| 2022/0185135 | A1* | 6/2022 | Langton | B60L 58/12 |
| 2022/0250506 | A1* | 8/2022 | Goldman-Shenhar | |
| | | | | G01C 21/3469 |
| 2022/0266720 | A1* | 8/2022 | Hariharan | H01M 10/6569 |
| 2023/0001824 | A1* | 1/2023 | Shaotran | H01M 10/633 |
| 2023/0020541 | A1* | 1/2023 | Nordholm | B60L 58/10 |

FOREIGN PATENT DOCUMENTS

| | | | |
|---|---|---|---|
| KR | 101870285 | B1 | 6/2018 |
| KR | 10-2019-0036134 | A | 4/2019 |
| KR | 10-2021-0021217 | A | 2/2021 |
| KR | 20210129893 | A | 10/2021 |

* cited by examiner

Figure 4:
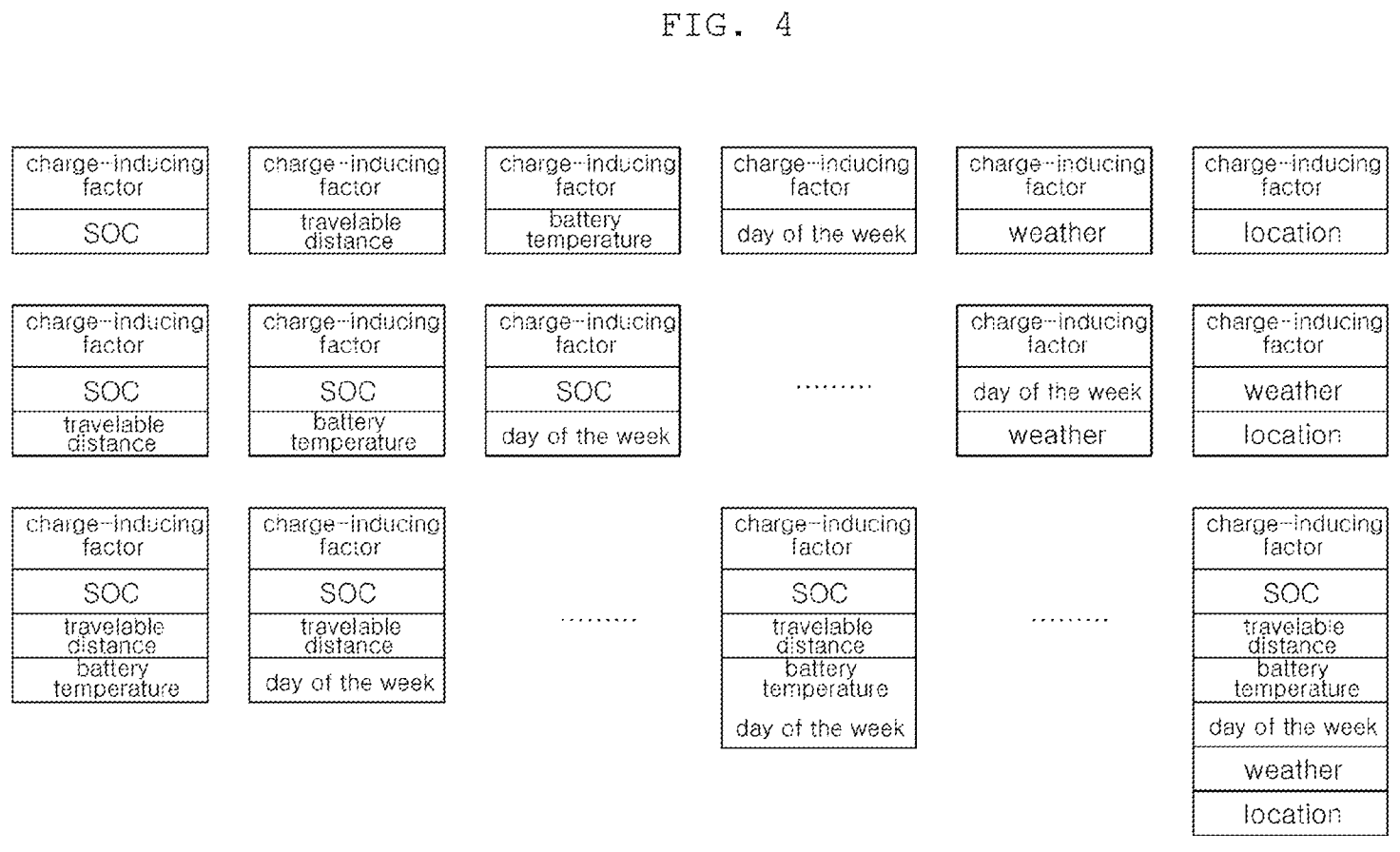

| charge-inducing factor |
|---|
| SOC |

| charge-inducing factor |
|---|
| travelable distance |

| charge-inducing factor |
|---|
| battery temperature |

| charge-inducing factor |
|---|
| day of the week |

| charge-inducing factor |
|---|
| weather |

| charge-inducing factor |
|---|
| location |

| charge-inducing factor | |
|---|---|
| SOC | travelable distance |

| charge-inducing factor | |
|---|---|
| SOC | battery temperature |

| charge-inducing factor | |
|---|---|
| SOC | day of the week |

| charge-inducing factor | |
|---|---|
| day of the week | weather |

| charge-inducing factor | |
|---|---|
| weather | location |

| charge-inducing factor | | |
|---|---|---|
| SOC | travelable distance | day of the week |

| charge-inducing factor | | | |
|---|---|---|---|
| SOC | travelable distance | battery temperature | day of the week |

| charge-inducing factor | | | | | |
|---|---|---|---|---|---|
| SOC | travelable distance | battery temperature | day of the week | weather | location |

Scenario A

| Charge-inducing factor | Condition |
|---|---|
| SOC | 20~30% |

Scenario B

| Charge-inducing factor | Condition |
|---|---|
| Travelable distance | <50km |

Scenario C

| Charge-inducing factor | Condition |
|---|---|
| Monday | - |
| SOC | ~40% |
| Location | Near workplace |

Scenario D

| Charge-inducing factor | Condition |
|---|---|
| Saturday | - |
| SOC | ~60% |
| Travelable distance | <100km |
| Weather | Sunny |

Scenario A

| Charge-inducing factor | Condition |
|---|---|
| SOC | 20~30% |
| Scenario confidence level | 0.7 |

Scenario B

| Charge-inducing factor | Condition |
|---|---|
| Travelable distance | <50km |
| Scenario confidence level | 0.9 |

Scenario C

| Charge-inducing factor | Condition |
|---|---|
| Monday | - |
| SOC | ~40% |
| Location | Near workplace |
| Scenario confidence level | 0.8 |

Scenario D

| Charge-inducing factor | Condition |
|---|---|
| Saturday | - |
| SOC | ~60% |
| Travelable distance | <100km |
| Weather | Sunny |
| Scenario confidence level | 0.5 |

| Charge-inducing factor | Condition |
|---|---|
| Saturday | - |
| SOC | <60% |
| Travelable distance | <100km |
| Weather | Sunny |
| Scenario confidence level | 0.7 |

| Charge-inducing factor | Condition |
|---|---|
| Saturday | - |
| SOC | <60% |
| Travelable distance | <80km |
| Weather | Sunny |
| Scenario confidence level | 0.8 |

| Charge-inducing factor | Condition |
|---|---|
| Saturday | - |
| SOC | <55% |
| Travelable distance | <80km |
| Weather | Sunny |
| Scenario confidence level | ≈ 1 |

ELECTRIFIED VEHICLE AND METHOD OF CONTROLLING BATTERY CONDITIONING THEREFOR

CROSS REFERENCE TO RELATED APPLICATION

The present application claims priority to Korean Patent Application No. 10-2022-0023140, filed on Feb. 22, 2022, the entire contents of which are incorporated herein by reference for all purposes.

TECHNICAL FIELD

The present disclosure relates to an electrified vehicle capable of performing battery conditioning based on various charge-inducing factors, and a method of controlling a battery conditioning therefor.

BACKGROUND

An electrified vehicle may refer to a vehicle provided with an electric motor as a driving source, and in particular, a plug-in hybrid electric vehicle (PHEV) or an electric vehicle (EV) may charge a battery with external power using a charging plug.

SUMMARY

The following summary presents a simplified summary of certain features. The summary is not an extensive overview and is not intended to identify key or critical elements.

When charging the battery, the temperature of the battery may significantly affect the charging time. Therefore, if the temperature of the battery is properly increased in advance (e.g., by using a method of circulating fluid, such as water, heated by an electric heater around the battery), the charging time may be shortened. The control of raising the temperature of battery in advance may be referred to as "Battery Conditioning" or "Battery Pre-Conditioning".

However, since battery conditioning consumes energy to raise the temperature of battery, it is important to accurately predict and determine a user's intention to charge of a vehicle from the vehicle's viewpoint. In other words, if the battery conditioning is performed by successfully predicting the charging time according to the intention to charge, the customer's satisfaction may be improved by reducing the charging time, but if the prediction fails, energy for heating the fluid is wasted.

The general battery conditioning control may be applied uniformly by selecting battery conditioning conditions in advance to determine user's intention to charge. For example, if battery conditioning is applied only when a charging station is set as a destination, users who do not set the destination through the navigation system will not be able to use the battery conditioning function at all. Also, unnecessary battery conditioning may be performed due to the reason that there is a charging station near a set destination even when the user does not have the intention to charge the battery at the charging station.

Consequently, the general battery conditioning control has problem(s) in that the prediction of battery charging is not accurate and/or the prediction in determining whether the user intends to charge the battery.

A method may comprise multiple operations. The method may comprise: determining, by a computing device, that a battery conditioning scenario is satisfied, wherein the battery conditioning scenario is associated with at least one charging-inducing factor; performing, based on the battery conditioning scenario being satisfied, a battery conditioning operation to change a temperature of a battery of a vehicle; and updating, based on an occurrence or absence of a battery charging event associated with the battery conditioning operation, a confidence level associated with the battery conditioning scenario.

An apparatus of a vehicle may perform a method comprising multiple operations. The vehicle may comprise: a battery configured to supply power to the vehicle; a temperature controller configured to control a temperature of the battery; and a controller. The controller may be configured to: determine that a battery conditioning scenario is satisfied, wherein the battery conditioning scenario is associated with at least one charging-inducing factor; instruct, based on the battery conditioning scenario being satisfied, the temperature controller to perform a battery conditioning operation for the battery; and update, based on an occurrence or absence of a battery charging event associated with the battery conditioning operation, a confidence level associated with the battery conditioning scenario.

These and other features and advantages are described in greater detail below.

BRIEF DESCRIPTION OF THE DRAWINGS

FIG. 4 shows an example of a set configuration according to a factor combination.

FIG. 5 shows an example of a configuration of a probability-based scenario.

DETAILED DESCRIPTION

Figure 1:
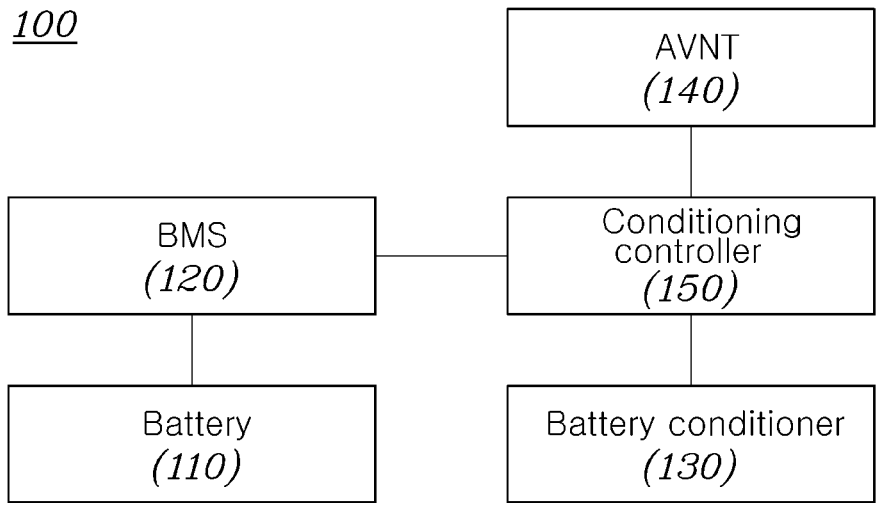
FIG. 1 shows an example of the configuration of an electrified vehicle.

Hereinafter, examples of the present disclosure will be described in detail with reference to the attached drawings, to allow one of ordinary skilled in the art to easily execute. However, the present disclosure may be provided in various different forms and is not limited to the embodiment(s) described herein. Also, in the drawings, in order to clearly describe the embodiment(s), an irrelevant part will be omitted. Throughout the specification, like reference numerals refer to like elements.

In addition, unless explicitly described to the contrary, the word "comprise" and variations such as "comprises" or "comprising" will be understood to imply the inclusion of stated elements but not the exclusion of any other elements. Also, like reference numerals designate like elements throughout the specification.

In addition, a unit or control unit in certain terminology such as a hybrid control unit (HCU) is a term widely used for a controller that controls a vehicle-specific function and does not imply a general functional unit. For example, each controller may be a communication device that communicates with other controllers or sensors to control the function that is responsible for, a memory that stores an operating system or logic commands and input/output information, and one or more processor that performs determination, calculation, decision, and the like, which is necessary for the control the function that is responsible therefor.

In the present disclosure, in performing battery conditioning control in an electrified vehicle capable of charging a battery using external power, a combination factor referred to by a user in deciding battery charging may be set to at least one scenario based on a probability of actual charging, and a condition of each factor for each scenario may be updated in a way to improve the confidence level such that the charging prediction rate is improved, thereby a battery conditioning is performed efficiently.

FIG. 1 shows an example of the configuration of an electrified vehicle.

Referring to FIG. 1, a vehicle (e.g., an electrified vehicle 100) may include a battery 110 (e.g., a battery for operating the electrified vehicle 100), a battery management system (BMS) 120, a battery conditioner 130, a user interface (e.g., an Audio/Video/Navigation Terminal (AVNT) 140), and a conditioning controller 150. FIG. 1 mainly shows example components, and it is apparent to those skilled in the art that more or fewer components may be included in the actual vehicle implementation. Hereinafter, each component will be described.

First, the battery 110 may supply power to an electric motor (not shown), which is a driving source of the electrified vehicle 100, or may be charged with power generated by regenerative braking in the electric motor. The battery 110 may be charged through external power supplied by connecting a charging plug to an external power supply.

The BMS 120 may be configured to manage a state of the battery, for example, a state of charge (SOC), temperature, current, voltage, state of health (SOH), and the like.

The battery conditioner 130 may perform an operation that changes (e.g., raises) the temperature of the battery 110, and the battery conditioner 130 may include a heater and a pump that allows the circulating of the fluid, heated by the heater, around the battery 110. Additionally or alternatively, various components for temperature change of the battery 110 may be possible.

In addition to the basic operations, such as audio, video input/output, and navigation, the AVNT 140 may obtain information on certain factors (e.g., environmental factors) among factors affecting the determination of the user to charge the battery. The information may be obtained through communication with an external object, for example, a telematics center or a connected car service server, etc. Examples of specific types of factors will be described later in more detail.

The conditioning controller 150 may obtain information on one or more battery factors among factors associated with the battery charging decision of the user. The information may be obtained from the BMS 120. The conditioning controller 150 may obtain the information on the environmental factor from the AVNT 140, and may determine whether to perform scenario-based battery conditioning (more detailed examples will be described later). To perform the battery conditioning, the conditioning controller 150 may transmit battery conditioning commands to change (e.g., adjust, raise) the temperature of the battery 110 to the battery conditioner 130.

The conditioning controller 150 may be implemented in a separate controller may be implemented in a controller generally mounted in electrified vehicles, or may be implemented the form of two or more controllers. For example, the mounted controller may be a vehicle control unit (VUC) in an electric vehicle, and may be a hybrid control unit (HCU) in a plug-in hybrid vehicle, but aspects of the present disclosure is not limited thereto.

Hereinafter, one or more examples of a battery conditioning control method is described based on the aforementioned vehicle structure.

Figure 2:
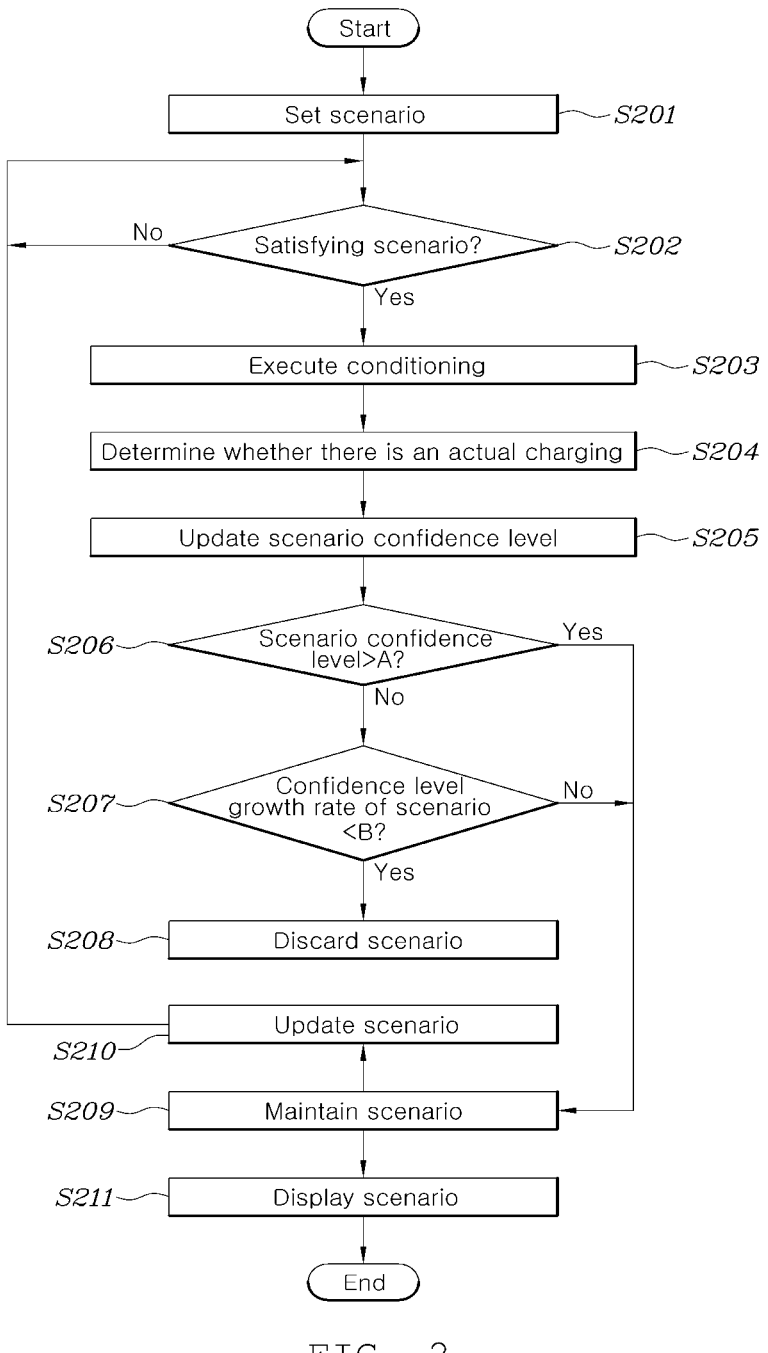
FIG. 2 is a flowchart showing an example of a battery conditioning process for an electrified vehicle.

FIG. 2 is a flowchart showing an example of a battery conditioning process for an electrified vehicle.

Referring to FIG. 2, a scenario may be set (S201). A process for setting a scenario is described in detail with reference to FIG. 3.

Figure 3:
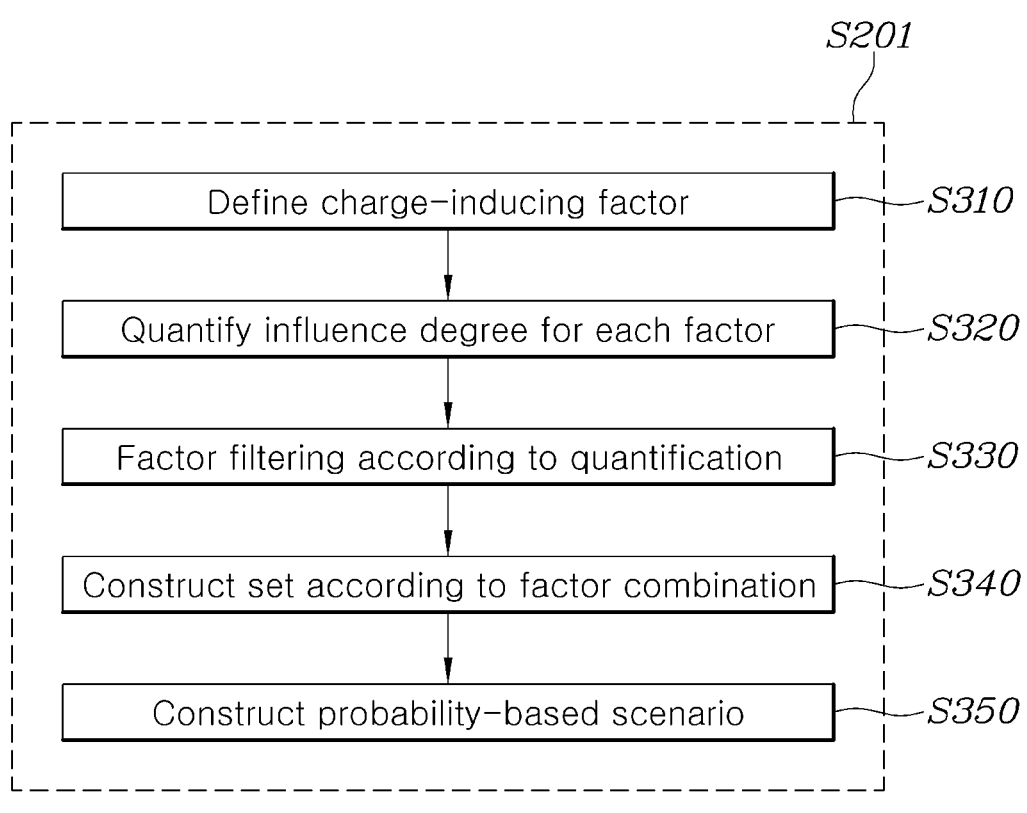
FIG. 3 is a flowchart showing an example of a specific process for a step of setting a scenario.

FIG. 3 is a flowchart showing an example of a specific process for setting a scenario (e.g., the step of setting a scenario shown in FIG. 2).

Referring to FIG. 3, a charge-inducing factor may be defined (S310). Here, the term charge-inducing factor may refer to at least one factor that is associated with a potential battery charging event. For example, the at least one factor may be associated with the driver's intention to charging the battery in the near future and/or may affect/induce the electric vehicle's user (e.g., a driver of the vehicle) to perform battery charging using external power.

The charge-inducing factor(s) may include one or more factors (e.g., the battery factor, the environmental factor, etc.) The battery factor may be included as one of the charge-inducing factor(s) according to the state of the battery (e.g., the remaining battery charge is low) The environmental factor may be included as one of the charge-inducing factor(s) according to the external environment of the battery and/or of the vehicle. For example, the battery factor may include a state of charge (SOC), an estimated travelable distance (e.g., an estimated distance remaining, miles remaining on a vehicle's battery charge, estimated miles remaining, estimated battery remaining, distance to empty, driving to empty (DTE), miles to empty, a distance that the vehicle can drive with the remaining charge of the battery, etc.), a battery temperature, and/or a state of health (SOH). For example, the environmental factor may include season, day of the week, a type of weather (e.g., temperature, wind, humidity, precipitation, cloudiness, etc.), and/or location (e.g., the current location of the vehicle, a location of a battery charging station) associated with the vehicle. Each constituting factor of the battery factor and the environmental factor is exemplary, and aspects are not limited thereto.

Among the battery factors, information on the SOC, battery temperature, SOH, and the like may be obtained, for example, from the battery controller 120. The estimated range may be obtained, for example, from a controller (e.g., a high-level controller, the VCU, HCU) capable of managing the information on SOC, average load of the vehicle operation, and fuel efficiency together. The environmental factor may be obtained, for example, from the AVNT 140 and/or a sensor provided in the vehicle.

In step S310, each factor may be stored in the conditioning controller 150 in advance or set by a user through a user setting menu (USM).

If the charge-inducing factor(s) is/are defined, the weight of each factor may be quantified (S320). Step S320 may include a process of determining a condition value for each factor for each band and calculating a charging entry probability for each band to quantify the highest probability as a correlation factor.

For example, if the factor is SOC, as shown in Table 1, the correlation factor may be obtained based on a charging entry probability for each SOC band.

TABLE 1

| SOC band | Number of charging entry | Probability [%] | Factor (Correlation) |
|---|---|---|---|
| 0-10% | 6 | 12 | 0.8 |
| 10-20% | 4 | 8 | |
| 20-30% | 40 | 80 | |
| . . . | . . . | | |
| 70-80% | 1 | 2 | |
| 80% or greater | 0 | 0 | |
| Total | 50 | | |

Referring to Table 1, the highest number of charging entries may be in the 20 to 30% band, and if its probability is 80%, which may be the highest probability among the probabilities associated with the SOC bands, the correlation factor of the SOC factor may be determined as 0.8.

As another example, if the factor is a day of the week, as shown in Table 2 below, a correlation factor may be obtained based on the charging entry probability for each day of the week.

TABLE 2

| Day of the week | Number of charging entry | Probability [%] | Factor (Correlation) |
|---|---|---|---|
| Monday | 1 | 2 | 0.6 |
| Tuesday | 5 | 10 | |
| Wednesday | 5 | 10 | |
| . . . | . . . | | |
| Saturday | 20 | 60 | |
| Sunday | 10 | 10 | |
| Total | 50 | | |

Referring to Table 2, most charging entries may occur on Saturdays, and Saturday may be associated with the highest number of charging entries. If its probability is 60%, the correlation factor of the SOC factor may be determined as 0.6.

Information on the number of times of charging entry for each band used for determining the weight (e.g., an influence degree) of each factor may be obtained by the big data or statistical data, but aspects are not necessarily limited thereto. One or more artificial intelligence models (e.g., supervised learning, unsupervised learning, reinforced learning, deep learning, etc.) may be used to determine the weight of each factor and/or to predict whether a battery charging event would occur (e.g., the driver intends to charge the battery at a battery charging station).

If the weight of each factor is quantified, a factor filtering may be performed (S330). The factor filtering may be referred to as an exclusion of a factor having the weight that does not satisfy a certain value (e.g., a threshold) from the prediction of a potential battery charging event. For example, as shown in Table 3, the weight (e.g., influence degree) for each factor constituting the battery factor may be determined (e.g., assuming that the factors having the influence degree less than 0.5 is filtered).

TABLE 3

| Battery factor | Influence degree |
|---|---|
| SOC | 0.8 |
| Estimated range | 0.9 |
| Battery temperature | 0.6 |
| SOH | 0.3 |

As shown in Table 3, since the influence degree of the SOH factor is 0.3, which is less than 0.5, the SOH factor may be filtered out and may be excluded from a charging prediction process in the future.

If each factor is to be considered for predicting a potential battery charging event is determined through filtering, a set according to all possible factor combinations may be configured (S340). For example, through filtering, the quantity of deciding factors may be six: a SOC, an estimated travelable distance (e.g., a distance the vehicle can drive with the remaining charge of the battery, etc.), a battery temperature, a day of the week, a type of weather, and a location. The set configuration may be formed as shown in FIG. 4.

FIG. 4 shows an example of a set configuration according to a factor combination.

Referring to Table 4, the sets may be configured as many as the number of combinations (e.g., factorial (!) calculations) with respect to the number of factors (e.g., a set configured with only one factor, a set configured with two factors, . . . , a set configured with all six factors). In other words, if the number of final deciding factors is 6 (e.g., after the filtering process), the number of configured sets may be 6! (Factorial), which is 720.

Referring back to FIG. 3, a probability-based scenario may be constructed using the configured set (S350). The step S350 may include a process of constructing a scenario with the highest probability based on each set of charge-inducing factors by analyzing the conditions in which actual charging occurs. The aforementioned will be described in further detail with reference to FIG. 5.

FIG. 5 shows an example of a configuration of a probability-based scenario.

As described above, a probability-based scenario may be constructed using the configured set (S350). The step S350 may include a process of constructing the scenario with the highest probability based on each set of charge-inducing factors by analyzing the conditions in which actual charging occurs. The set of charge-inducing factors may be based on one of combinations having at least one charge-inducing factor, the scenario may be represented by at least a conditional value being assigned/given to each charge-inducing factor constituting an individual set of charge-inducing factors. The scenario may be further based on the confidence level. Aforementioned will be described in further detail with reference to FIG. 5.

FIG. 5 shows an example of a configuration of a probability-based scenario.

At the upper portion of FIG. 5, a state in which a charge-inducing factor constructs scenarios A to D and a condition for each factor is constructed. At the lower portion of FIG. 5, a state in which confidence level has been added for each scenario, in addition to the parameters and/or values shown in the scenarios of the upper portion of FIG. 5. The confidence level may be obtained based on the number of times the actual charging of the battery is performed after the battery conditioning is performed divided by the number of times the conditioning is performed under the corresponding scenario condition is satisfied. For example, the confidence level may be obtained based on the following equation:

$$\text{Confidence Level} = \frac{\text{\# of Actual Battery Charging Events}}{\text{\# of Battery Conditioning Performed}}$$

For example, in scenario A, if the probability of an actual charging event is the highest at 70% when the SOC is 20 to 30%, 0.7 is given as the scenario confidence level for the scenario.

However, since the confidence level information on each scenario of the vehicle may not be obtained at the beginning of step S350, a set value obtained through the AVNT 140 or a default/initial set value stored may be used.

Referring back to FIG. 2, the conditioning controller 150 may monitor the present battery factor and/or the environmental factor value, for example, after the scenario is set and may determine whether a satisfying scenario according to the conditions of each factor exists (S202).

If at least one satisfying scenario exists (Yes in S202), the conditioning controller 150 may transmit conditioning commands to the battery conditioner 130 so that the battery conditioning is performed (S203).

The conditioning controller 150 may check whether the actual charging is performed, for example, after the battery conditioning procedure (S204) and may update the scenario confidence level according to the result (e.g., whether the actual battery charging is performed) (S205). Information indicating whether the charging is performed may be obtained from the BMS 120, the controller (e.g., VCU, HCU, etc.), and/or a charging controller, for example, an on-board charger (OBC) or a power line communication (PLC) controller, but aspects are not limited thereto. The actual charging may be a charging event performed within a predetermined time after the battery conditioning is performed or before the temperature of the battery 110 drops to a level requiring the battery conditioning again, but aspects of the present disclosure are not limited thereto.

As an example of confidence level update, if it is assumed that the battery conditioning has been performed four times) to satisfy the conditions of a specific scenario and the battery has been actually charged three times, and the confidence level was 0.75 (3 divided by 4) and if an additional battery conditioning and an additional actual charging are performed, an updated confidence level for the scenario is ⅘, which is 0.8 (e.g., (3+1)/(4+1).

After updating the scenario confidence level, the conditioning controller 150 may compare the updated scenario confidence level with a predetermined confidence level (a reference confidence level: A, for example, 0.7) (S206), and if the updated scenario confidence level is less than the reference confidence level (No in S206), the confidence level growth rate of the corresponding scenario may be compared with a predetermined confidence level growth rate (a reference confidence level growth rate: B, for example, 0.1) (S207). The confidence level growth rate may be a growth rate for a certain period (for example, one month or any other time duration) and may be referred to as increased value rather than a ratio. If the growth rate of the corresponding scenario confidence level is less than the reference B (Yes in S207), the corresponding scenario may be discarded (e.g., the scenario does not provide accurate prediction results) (S208). The numerical values for reference confidence level (A) and reference confidence level growth rate (B) and the collection period for determining the growth rate are exemplary, and other modifications may be implemented.

If the updated scenario confidence level is greater than the predetermined reference A (Yes in S206), or if the confidence level of the updated scenario is less than or equal to the predetermined reference A and the confidence level growth rate of the scenario is greater than or equal to the predetermined reference confidence level growth rate B (No in S207), the conditioning control 150 may maintain the corresponding scenario (e.g., not discarding the scenario) (S209).

The conditioning controller 150 may update at least part of the conditions for each charge-inducing factor constructing the scenario to increase the confidence level (S210). As the scenario is being updated, the scenario confidence level increases. If sufficient amount of data is collected, the confidence level of the scenario converges to a threshold value. If the scenario confidence level is 1 (or a satisfying value, such as 0.9, 0.95, etc.), the charging scenario may be maintained, and the controller may continue to update modify the scenario to maintain the confidence level. The purpose of the update is to maintain the confidence level of the currently adopted scenario (e.g., the prediction success rate) approaches 1 and the prediction failure rate of the currently adopted scenario approaches 0. the prediction success rate may refer to a probability of performing an actual battery charging operation after a battery conditioning operation. For example, a prediction success rate for a scenario=the number/quantity of actual battery charging events after performing battery conditioning divided by the number/quantity of battery conditioning operations. The number/quantity of predicted battery charging events may equal to the number/quantity of battery conditioning operations, for example, if the controller performs a battery conditioning operation as it predicts a battery charging event would likely occur (e.g., the probability of a battery charging event occurrence is greater than or equal to a threshold). The failure rate may refer to a probability of not performing a battery charging operation after a battery conditioning operation. For example, a prediction failure rate for the scenario=the number/quantity of battery conditioning operations that are not followed by actual battery charging events divided by the number/quantity of battery conditioning operation. A specific example of such an update execution configuration will be described with reference to FIG. 6.

Figure 6:
FIG. 6 shows an example of a scenario update.

FIG. 6 shows an example of a configuration of a scenario update.

FIG. 6 shows a process of updating a specific scenario (e.g., the update of the scenario from the leftmost table to the rightmost table). First, referring to the scenario information on the leftmost table, the scenario confidence level is 0.7. As the state of the estimated travelable distance is changed to 80 km as the remaining battery charge decreases, thus the confidence level may be increased to 0.8 (e.g., as shown in the second table in FIG. 6). As the condition of the SOC factor is changed to 55%, the conditional value of the scenario may be fixed as the scenario confidence level approaches 1.

A managed scenario as described above may be displayed on a display device of the AVNT 140, cluster, or a head-up display (HUD) in the vehicle. The display device may display the scenario information shown in FIG. 6 or show the information of the scenario in a different format, which may be similar to the tables shown in FIG. 6. The vehicle user may modify one or more parameters of the scenario, such as modification of a condition, an addition of a charge-inducing factor, through a predetermined menu operation, etc. The vehicle user may deactivate the scenario, for example, if the user does not intend to charge the battery.

Information on scenarios managed by individual electrified vehicles can be transmitted to external entities such as connected car service servers or telematics centers, and information on collected scenarios can be grouped into a plurality of groups according to various conditions, including the class of vehicle, region, driver's age, and gender. Scenarios with common factors and conditions among the various scenarios of vehicles belonging to each group may be extracted, and the extracted scenario may be designated as a common scenario. The pre-learned charging scenario may be stored in a database, and a vehicle associated with the group may perform battery conditioning using one or more charging scenarios of the group (e.g., applied to step S201) without an initial scenario learning process.

It is an object of the present disclosure to provide an electric vehicle capable of more accurately determining whether to charge a battery of the vehicle (e.g., by predicting a battery charging event) using external power and a battery conditioning control method therefor.

Technical objects to be achieved by the present disclosure are not limited to the technical objects described above, and other technical objects not described will be clearly understood by those skilled in the art to which the present disclosure pertains.

To accomplish the object, according to an aspect of the present disclosure, there is a provided a battery conditioning method for an electrified vehicle comprising the steps of: determining whether one or more scenarios in which conditions are defined for each of at least one charge-inducing factors are satisfied; performing battery conditioning to raise the temperature of the battery when a satisfying scenario exists among the one or more scenarios; and updating the confidence level of the satisfying scenario according to whether actual charging occurs after the battery conditioning is performed.

For example, at least one of the charge-inducing factors may include at least one of the battery factors and environmental factors.

For example, the battery factor may include at least one of a state of charge (SOC), a travelable distance, a battery temperature, and a state of health (SOH). The environmental factors may include at least one of a season, a day of the week, weather, and a location.

For example, the confidence level may be a value obtained by dividing the number of times the actual charging occurs after the battery conditioning is performed by the number of times the battery conditioning is performed in accordance with the satisfying scenario.

For example, the method may further include the step of updating or discarding the satisfying scenario based on the updated confidence level.

For example, the step of updating or discarding may include discarding the satisfying scenario when the updated confidence level is less than or equal to a first reference and the confidence level growth rate and the confidence level growth rate of the satisfying scenario is less than a second reference.

For example, the step of updating or discarding may include updating at least a part of the conditions for each of the at least one charge-inducing factors constructing the satisfying scenario in a way in which the confidence level increases.

For example, the method may further include setting at least one or more of the scenarios before determining.

For example, the step of setting may include steps of: defining at least one of the charge-inducing factor; quantifying the influence degree of each of at least one of the charge-inducing factors; configuring a plurality of sets according to a combination of the at least charge-inducing factor; constructing the one or more scenarios by applying a condition to the at least one charge-inducing factor configuring each of the plurality of sets.

The electrified vehicle according to an embodiment of the present disclosure, the electrified vehicle includes: a battery; a temperature-raising device that raises the temperature of the battery; and a controller that determines whether one or more scenarios in which conditions for each of the at least one charge-inducing factors defined are satisfied, and instructs the temperature-raising device to condition the battery when a satisfying scenario exists among the one or more scenarios, wherein the controller may update the confidence level of the satisfying scenario according to whether actual charging occurs after the battery conditioning is performed.

For example, at least one of the charge-inducing factors may include at least one of the battery factors and environmental factors.

For example, the battery factor may include at least one of a state of charge (SOC), a travelable distance, a battery temperature, and a state of health (SOH). The environmental factors may include at least one of a season, a day of the week, weather, and a location.

For example, the confidence level may be a value obtained by dividing the number of times the actual charging occurs after the battery conditioning is performed by the number of times the battery conditioning is performed in accordance with the satisfying scenario.

For example, the controller may update or discard the satisfying scenario based on the updated confidence level.

For example, the controller may discard the satisfying scenario when the updated confidence level is less than or equal to a first reference and the confidence level growth rate and the confidence level growth rate of the satisfying scenario is less than a second reference.

For example, the controller may update at least a part of the conditions for each of at least one charge-inducing factor constructing the satisfying scenario in a way that increases the confidence level.

For example, the controller may set one or more scenarios before determining whether one or more of the scenarios are satisfied.

For example, the controller is configured to define the at least one of the charge-inducing factors, quantify the influence degree of each of the at least one charge-inducing factor, configure a plurality of sets according to a combination of the at least charge-inducing factor, construct one or more of the scenarios by applying a condition to at least one charge-inducing factors configuring each of the plurality of sets.

An electrified vehicle, according to at least one embodiment of the present disclosure, configured as above-mentioned, may more accurately predict the intention to charge a user so that a battery conditioning control may be performed.

Improving the prediction accuracy reduces the charging time when the battery is being charged, and unnecessary battery conditioning is not performed, preventing energy wastage.

The effects of the present disclosure are not limited to the above-described effects and other effects which are not described herein will become apparent to those skilled in the art from the following description.

One or more features of the present disclosure may be implemented as computer-readable code on a medium on which a program is recorded. The computer-readable medium may include recording devices in which data readable by a computer system is stored. Examples of computer-readable medium include hard disk drive (HDD), solid-state disk (SSD), silicon disk drive (SDD), ROM, RAM, CD-ROM, magnetic tape, floppy disk, optical data storage device, and the like.

One or more aspects of the disclosure may be embodied in computer-usable data or computer-executable instructions, such as in one or more program modules, executed by one or more computers or other devices to perform the operations described herein. Generally, program modules include routines, programs, objects, components, data structures, and the like that perform particular tasks or implement particular abstract data types when executed by one or more processors in a computer or other data processing device. The computer-executable instructions may be stored as computer-readable instructions on a computer-readable medium such as a hard disk, optical disk, removable storage media, solid-state memory, RAM, and the like. The functionality of the program modules may be combined or distributed as desired in various embodiments. In addition, the functionality may be embodied in whole or in part in firmware or hardware equivalents, such as integrated circuits, application-specific integrated circuits (ASICs), field programmable gate arrays (FPGA), and the like. Particular data structures may be used to more effectively implement one or more aspects of the disclosure, and such data structures are contemplated to be within the scope of computer executable instructions and computer-usable data described herein.

Various aspects described herein may be embodied as a method, an apparatus, or as one or more computer-readable media storing computer-executable instructions. Accordingly, those aspects may take the form of an entirely hardware embodiment, an entirely software embodiment, an entirely firmware embodiment, or an embodiment combining software, hardware, and firmware aspects in any combination. In addition, various signals representing data or events as described herein may be transferred between a source and a destination in the form of light or electromagnetic waves traveling through signal-conducting media such as metal wires, optical fibers, or wireless transmission media (e.g., air or space). In general, the one or more computer-readable media may be and/or include one or more non-transitory computer-readable media.

As described herein, the various methods and acts may be operative across one or more computing servers and one or more networks. The functionality may be distributed in any manner, or may be located in a single computing device (e.g., a server, a client computer, and the like). For example, in alternative embodiments, one or more of the computing platforms discussed above may be combined into a single computing platform, and the various functions of each computing platform may be performed by the single computing platform. In such arrangements, any and/or all of the above-discussed communications between computing platforms may correspond to data being accessed, moved, modified, updated, and/or otherwise used by the single computing platform.

Aspects of the disclosure have been described in terms of illustrative embodiment(s) thereof. Numerous other embodiment(s), modification(s), and variation(s) within the scope and spirit of the appended claims will occur to persons of ordinary skill in the art from a review of this disclosure. For example, one or more of the steps depicted in the illustrative figures may be performed in other than the recited order, and one or more depicted steps may be optional in accordance with aspects of the disclosure.

What is claimed is:

1. A method comprising:
determining, by a computing device, that a battery conditioning scenario is satisfied, wherein the battery conditioning scenario is associated with at least one charging-inducing factor;
performing, based on the battery conditioning scenario being satisfied, a battery conditioning operation to change a temperature of a battery of a vehicle; and
updating, based on an occurrence or absence of a battery charging event associated with the battery conditioning operation, a confidence level associated with the battery conditioning scenario,
wherein the confidence level indicates a likelihood of a battery charging occurrence under the battery conditioning scenario, and
wherein the method further comprises:
based on a first charging probability value associated with a first charging-inducing factor of the at least one charging-inducing factor, determining, by the computing device, a first correlation factor associated with the first charging-inducing factor;
based on a second charging probability value associated with a second charging-inducing factor of the at least one charging-inducing factor, determining, by the computing device, a second correlation factor associated with the second charging-inducing factor; and
based on the first charging probability value and the second charging probability value, determining, by the computing device, whether to include the first charging-inducing factor in the battery conditioning scenario and whether to include the second charging-inducing factor in the battery conditioning scenario.

2. The method of claim 1,
wherein the at least one charging-inducing factor includes at least one of:
a battery factor; or
an environmental factor.

3. The method of claim 2, wherein the battery factor includes at least one of:
a state of charge of the battery;
a travelable distance of the vehicle;
a battery temperature; or
a state of health of the battery; and
wherein the environmental factor includes at least one of:
a season;
a day of a week;
a type of weather; or
a location associated with the vehicle.

4. The method of claim 1,
wherein the confidence level is associated with a value obtained by dividing a quantity of actual battery charging events associated with battery conditioning operations by a quantity of battery conditioning operations performed based on the battery conditioning scenario being satisfied.

5. The method of claim 1, further including:
updating or discarding, based on the updated confidence level, the battery conditioning scenario.

6. The method of claim 5,
wherein the discarding the battery conditioning scenario is:
based on the updated confidence level not satisfying a first threshold and based on a confidence level growth rate of the battery conditioning scenario not satisfying a second threshold.

7. The method of claim 5,
wherein the updating the battery conditioning scenario comprises:
updating, based on at least one battery charging event, at least a part of a condition for the at least one charging-inducing factor.

8. The method of claim 1, further comprising:
prior to the determining that the battery conditioning scenario is satisfied, selecting the battery conditioning scenario among a plurality of battery conditioning scenarios.

9. The method of claim 8,
wherein the selecting the battery conditioning scenario comprises:
determining a plurality of charging-inducing factors including the at least one charging-inducing factor;
determining a weight of each of the plurality of charging-inducing factors;
determining at least one factor set based on a combination of at least two charging-inducing factors of the plurality of charging-inducing factors; and
determining, based on the at least one factor set, the battery conditioning scenario of the plurality of battery conditioning scenarios.

10. A vehicle comprising:
a battery configured to supply power to the vehicle;
a temperature controller configured to control a temperature of the battery; and
a controller configured to:
determine that a battery conditioning scenario is satisfied, wherein the battery conditioning scenario is associated with at least one charging-inducing factor;
instruct, based on the battery conditioning scenario being satisfied, the temperature controller to perform a battery conditioning operation for the battery; and
update, based on an occurrence or absence of a battery charging event associated with the battery conditioning operation, a confidence level associated with the battery conditioning scenario,
wherein the confidence level indicates a likelihood of a battery charging occurrence under the battery conditioning scenario, and
wherein the controller is configured to:
determine, based on a first charging probability value associated with a first charging-inducing factor of the at least one charging-inducing factor, a first correlation factor associated with the first charging-inducing factor;
determine, based on a second charging probability value associated with a second charging-inducing factor of the at least one charging-inducing factor, a second correlation factor associated with the second charging-inducing factor; and
determine, based on the first charging probability value and the second charging probability value, whether to include the first charging-inducing factor in the battery conditioning scenario and whether to include the second charging-inducing factor in the battery conditioning scenario.

11. The vehicle of claim 10,
wherein the at least one charging-inducing factor includes at least one of:
a battery factor; or
an environmental factor.

12. The vehicle of claim 11,
wherein the battery factor includes at least one of:
a state of charge of the battery;
a travelable distance of the vehicle;
a battery temperature; or
a state of health of the battery; and
wherein the environmental factor includes at least one of:
a season;
a day of a week;
a type of weather; or
a location associated with the vehicle.

13. The vehicle of claim 10,
wherein the confidence level is associated with a value obtained by dividing a quantity of actual battery charging events associated with battery conditioning operations by a quantity of battery conditioning operations performed based on the battery conditioning scenario being satisfied.

14. The vehicle of claim 10, wherein the controller is configured to update or discard, based on the updated confidence level, the battery conditioning scenario.

15. The vehicle of claim 14,
wherein the controller is configured to discard, based on the updated confidence level not satisfying a first threshold and based on a confidence level growth rate of the battery conditioning scenario not satisfying a second threshold, the battery conditioning scenario.

16. The vehicle of claim 14,
wherein the controller is configured to update, based on at least one battery charging event, at least a part of a condition for the at least one charging-inducing factor.

17. The vehicle of claim 10,
wherein, prior to determining that the battery conditioning scenario is satisfied, the controller is configured to select the battery conditioning scenario among a plurality of battery conditioning scenarios.

18. The vehicle of claim 17,
wherein the controller is configured to:
determine a plurality of charging-inducing factors including the at least one charging-inducing factor;
determine a weight of each of the plurality of charging-inducing factors;
determine at least one factor set based on a combination of at least two charging-inducing factors; and
determine, based on the at least one factor set, the battery conditioning scenario of the plurality of battery conditioning scenarios.

19. A vehicle comprising:
a battery configured to supply power to the vehicle;
a temperature controller configured to control a temperature of the battery; and
a controller configured to:
determine that a battery conditioning scenario is satisfied, wherein the battery conditioning scenario is associated with:
at least one condition value of each charging-inducing factor of a plurality of charging-inducing factors; and
a confidence level associated with the battery conditioning scenario;

control, based on the battery conditioning scenario being satisfied, the temperature controller to perform a battery conditioning operation for the battery; and update, based on an occurrence or absence of a battery charging event associated with the battery conditioning operation, the confidence level associated with the battery conditioning scenario, wherein the confidence level indicates a likelihood of a battery charging occurrence under the battery conditioning scenario, and wherein the controller is configured to:

determine, based on a first charging probability value associated with a first charging-inducing factor of the at least one charging-inducing factor, a first correlation factor associated with the first charging-inducing factor;

determine, based on a second charging probability value associated with a second charging-inducing factor of the at least one charging-inducing factor, a second correlation factor associated with the second charging-inducing factor; and determine, based on the first charging probability value and the second charging probability value, whether to include the first charging-inducing factor in the battery conditioning scenario and whether to include the second charging-inducing factor in the battery conditioning scenario.

* * * * *